United States Patent
Jo et al.

(10) Patent No.: US 12,224,314 B2
(45) Date of Patent: Feb. 11, 2025

(54) SIZE-CONTROLLABLE MULTI-STACK SEMICONDUCTOR DEVICE AND METHOD OF MANUFACTURING THE SAME

(71) Applicant: SAMSUNG ELECTRONICS CO., LTD., Suwon-si (KR)

(72) Inventors: Gunho Jo, Albany, NY (US); Ki-il Kim, Albany, NY (US); Byounghak Hong, Albany, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 714 days.

(21) Appl. No.: 17/402,214

(22) Filed: Aug. 13, 2021

(65) Prior Publication Data
US 2022/0336582 A1 Oct. 20, 2022

Related U.S. Application Data

(60) Provisional application No. 63/174,655, filed on Apr. 14, 2021.

(51) Int. Cl.
*H01L 29/06* (2006.01)
*H01L 27/088* (2006.01)
*H01L 29/423* (2006.01)
*H01L 29/66* (2006.01)
(Continued)

(52) U.S. Cl.
CPC ...... *H01L 29/0665* (2013.01); *H01L 27/0886* (2013.01); *H01L 29/42392* (2013.01); *H01L 29/66742* (2013.01); *H01L 29/7851* (2013.01); *H01L 29/78696* (2013.01)

(58) Field of Classification Search
CPC ....... H01L 21/02603; H01L 21/823431; H01L 21/823821; H01L 21/845; H01L 27/0886; H01L 27/0924; H01L 27/1211; H01L 29/0665; H01L 29/0669; H01L 29/0673; H01L 29/41791; H01L 29/42392; H01L 29/66439; H01L 29/66545; H01L 29/66742; H01L 29/66795; H01L 29/775; H01L 29/785; H01L 29/7851;
(Continued)

(56) References Cited

U.S. PATENT DOCUMENTS 10,483,166 B1 11/2019 Cheng et al.
10,685,887 B2 * 6/2020 Smith ................... H01L 27/092
2019/0393214 A1 * 12/2019 Lilak ............... H01L 21/823431
(Continued)

OTHER PUBLICATIONS

Communication issued Sep. 12, 2022 by the European Patent Office in counterpart European Patent Application No. 22167632.3.

*Primary Examiner* — David C Spalla
(74) *Attorney, Agent, or Firm* — Sughrue Mion, PLLC

(57) ABSTRACT

A multi-stack semiconductor device includes: a substrate; and a plurality of multi-stack transistor structures arranged on the substrate in a channel width direction, wherein the multi-stack transistor structure include at least one lower transistor structure and at least one upper transistor structure stacked above the lower transistor structure, wherein the lower and upper transistor structures include at least one channel layer as a current channel, wherein the lower transistor structures of at least two multi-stack transistor structures have different channel-layer widths.

20 Claims, 9 Drawing Sheets

(51) Int. Cl.
*H01L 29/78* (2006.01)
*H01L 29/786* (2006.01)

(58) Field of Classification Search
CPC ............. H01L 29/7853; H01L 29/7855; H01L 29/78696; H01L 2029/7858
See application file for complete search history.

(56) References Cited

U.S. PATENT DOCUMENTS

| | | |
|---|---|---|
| 2020/0006340 A1 | 1/2020 | Lilak et al. |
| 2020/0098756 A1 | 3/2020 | Lilak et al. |
| 2020/0294969 A1 | 9/2020 | Rachmady et al. |
| 2020/0295127 A1 | 9/2020 | Mannebach et al. |
| 2022/0005946 A1* | 1/2022 | Kim .................. H01L 29/42392 |
| 2023/0301051 A1* | 9/2023 | Liaw .................. H01L 29/4966 |
| | | 257/351 |

* cited by examiner

FIG. 2A
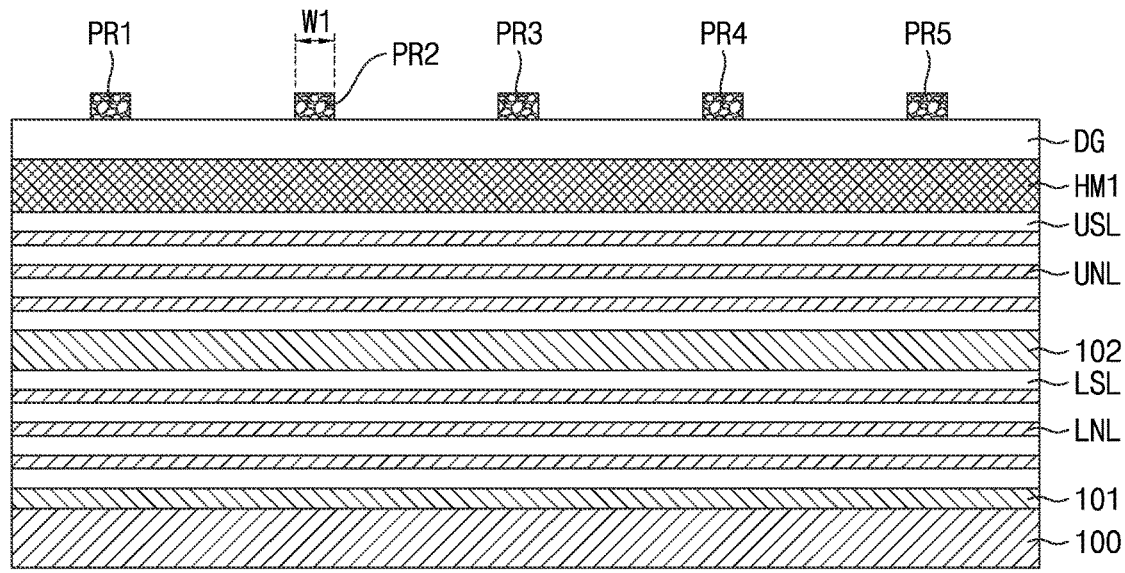
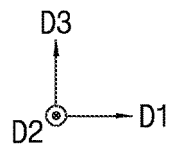
FIG. 2B
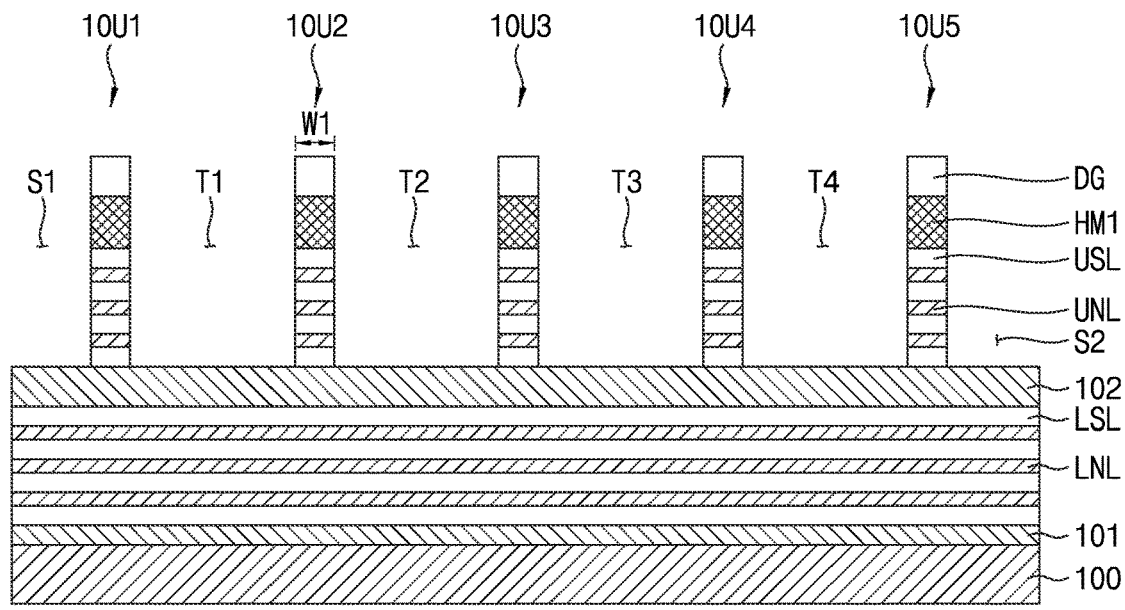
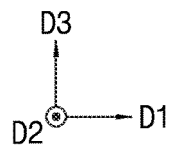

SIZE-CONTROLLABLE MULTI-STACK SEMICONDUCTOR DEVICE AND METHOD OF MANUFACTURING THE SAME

CROSS-REFERENCE TO THE RELATED APPLICATION

This application is based on and claims priority from U.S. Provisional Application No. 63/174,655 filed on Apr. 14, 2021 in the U.S. Patent and Trademark Office, the disclosure of which is incorporated herein in its entirety by reference.

BACKGROUND

1. Field

Apparatuses and methods consistent with example embodiments of the inventive concept relate to a multi-stack semiconductor device, more particularly, to a multi-stack semiconductor device having a plurality of transistor stacks having different channel widths.

2. Description of the Related Art

Increasing demand for high density semiconductor devices has introduced a nanosheet transistor characterized by multiple nanosheet layers bridging source/drain regions formed at both ends thereof and a gate structure that entirely wraps around all sides of the nanosheet layers. These nanosheet layers serve as a channel for current flow between the source/drain regions of the nanosheet transistor. Due to this structure, improved control of current flow through the nanosheet layers is enabled in addition to higher device density in a semiconductor device including the nanosheet transistor. The nanosheet transistor is also referred to as various different names such as multi-bridge channel FET (MBCFET), nanobeam, nanoribbon, superimposed channel device, etc.

A three-dimensional multi-stack nanosheet transistor structure has been implemented by stacking one nanosheet transistor structure on another nanosheet transistor structure, for example, to achieve a higher-density complementary metal-oxide semiconductor (CMOS) device in which a p-type field-effect transistor (PFET) and an n-type FET (NFET) are stacked at a lower stack and an upper stack, respectively. However, the inventors of the present invention have learned that there are many challenges to overcome in simply stacking nanosheet transistor structures to achieve a multi-stack nanosheet transistor structure required in the field for practical use. For example, it is very difficult to form and land contact structures on source/drain regions of a lower-stack nanosheet transistor. Further, it is necessary to form differently-sized multi-stack nanosheet structures on a same substrate depending on practical application in terms of current matching between upper-stack and lower-stack transistors and middle-of-line (MOL) structure (e.g., contract plug) formation.

Thus, the inventors have designed and developed a multi-stack nanosheet transistor structure having a size-controllable upper and lower stack nanosheet stacks as disclosed herein.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides a multi-stack semiconductor device having a lower nanosheet stack and an upper nanosheet stack having different sizes.

According to embodiments, there is provided a multi-stack semiconductor device which may include: a substrate; and a plurality of multi-stack transistor structures arranged on the substrate in a channel width direction, wherein the multi-stack transistor structure include at least one lower transistor structure and at least one upper transistor structure stacked above the lower transistor structure, wherein the lower and upper transistor structures include at least one channel layer as a current channel, wherein the lower transistor structures of at least two multi-stack transistor structures have different channel-layer widths.

According to embodiments, the upper transistor structures of the multi-stack transistor structures may have a same channel-layer width or different channel-layer widths.

According to embodiments, there is provided a multi-stack semiconductor device which may include: a substrate; and a plurality of multi-stack nanosheet structures arranged on the substrate in a channel width direction, wherein the multi-stack nanosheet structures include at least one lower nanosheet stack and at least one upper nanosheet stack formed above the lower nanosheet stack, wherein the lower and upper nanosheet stacks include a plurality of nanosheet layers as current channels for a transistor structure, and wherein the lower nanosheet stacks of a $1^{st}$ multi-stack nanosheet structure and a $2^{nd}$ multi-stack nanosheet structure among the multi-stack nanosheet structures have different channel widths, corresponding to widths of the nanosheet layers, in a channel width direction.

According to embodiments, the lower nanosheet stacks of a $3^{rd}$ multi-stack nanosheet structure and the $2^{nd}$ multi-stack nanosheet structure among the multi-stack nanosheet structures may have a same channel width, wherein the lower nanosheet stacks of the $2^{nd}$ and $3^{rd}$ multi-stack nanosheet structures have a greater channel width than the upper nanosheet stacks of the $2^{nd}$ and $3^{rd}$ multi-stack nanosheet structures, respectively, wherein, in the $2^{nd}$ multi-stack nanosheet structure, left side surfaces of the nanosheet layers of the lower nanosheet stack are vertically coplanar with left side surfaces of the nanosheet layers of the upper nanosheet stack, and right side surfaces of the nanosheet layers of the lower nanosheet stack are protruded from a vertical plane of right side surfaces of the nanosheet layers of the upper nanosheet stack, and wherein the $2^{nd}$ and $3^{rd}$ multi-stack nanosheet structures mirror-symmetric to each other in the channel width direction.

According to embodiments, there is provided a method of manufacturing a multi-stack semiconductor device, the method comprising operations of: (a) stacking at least one set of lower nanosheet layers and sacrificial layers, and at least one set of upper nanosheet layers and sacrificial layers in this order on a substrate; (b) patterning the set of upper nanosheet layers and sacrificial layers to obtain a plurality of upper nanosheet stacks arranged on the isolation layer; (c) conformally forming a $1^{st}$ spacer layer on the upper nanosheet stacks; (d) selectively removing the $1^{st}$ spacer layer formed on sidewalls of the upper nanosheet stacks such that the $1^{st}$ spacer layer on both sidewalls of a $1^{st}$ upper nanosheet stack and only one of two sidewalls of a $2^{nd}$ upper nanosheet stack are removed; and (e) patterning the set of lower nanosheet layers and sacrificial layers using the remaining $1^{st}$ spacer layer as mask to obtain a plurality of lower nanosheet stacks corresponding to the upper nanosheet stacks such that a width of a $2^{nd}$ lower nanosheet stack patterned below the $2^{nd}$ upper nanosheet stack is greater than a width of a $1^{st}$ lower nanosheet stack patterned below the $1^{st}$ upper nanosheet stack by a thickness of the $1^{st}$ spacer layer.

BRIEF DESCRIPTION OF THE DRAWINGS

Example embodiments of the inventive concept will be more clearly understood from the following detailed description taken in conjunction with the accompanying drawings in which:

FIGS. 2A-2I illustrate a method of manufacturing a multi-stack semiconductor device, according to embodiments;

DETAILED DESCRIPTION OF THE EMBODIMENTS

Figure 1A:
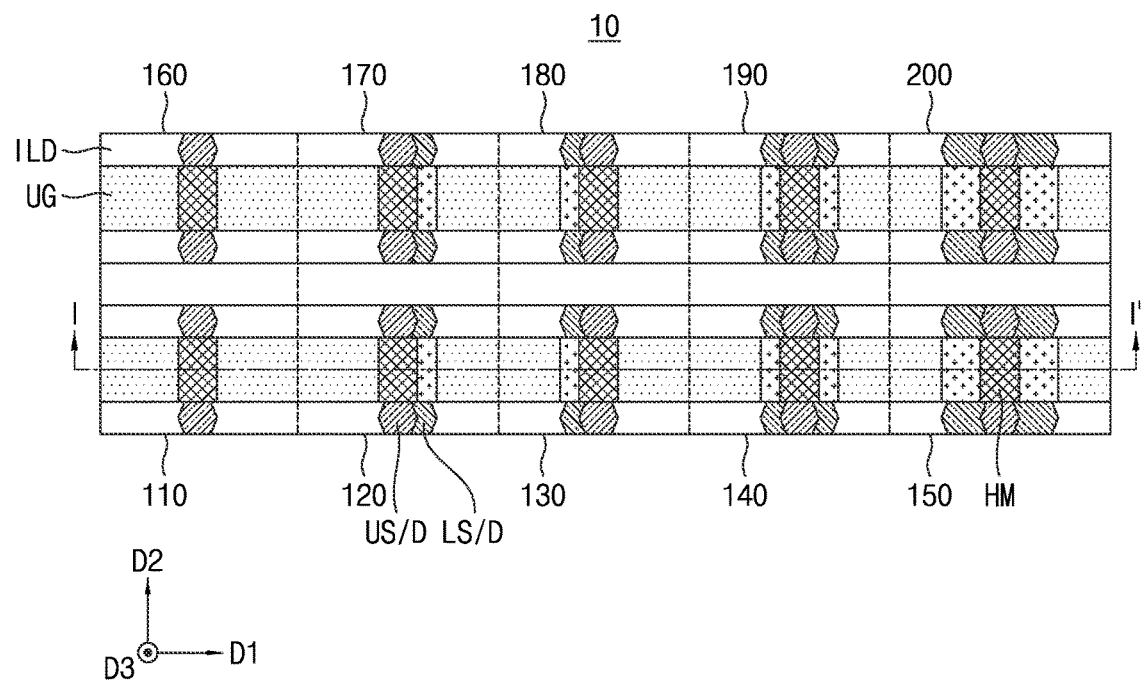
FIG. 1A illustrates a top plan view of a multi-stack semiconductor device, according to an embodiment.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a metal-oxide semiconductor field-effect transistor (MOSFET) described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension. Further, for brevity purposes, when an expression "at least one certain thing" is repeated in a subsequent description, it may be represented as "the certain thing" instead of "the at least one certain thing," and also, when an expression "at least one of certain things" is repeated in a subsequent description, it may be represented as "the certain things" instead of "the at least one of the certain things."

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including a nanosheet structure or nanosheet transistor may or may not be described in detail herein.

Figure 1B:
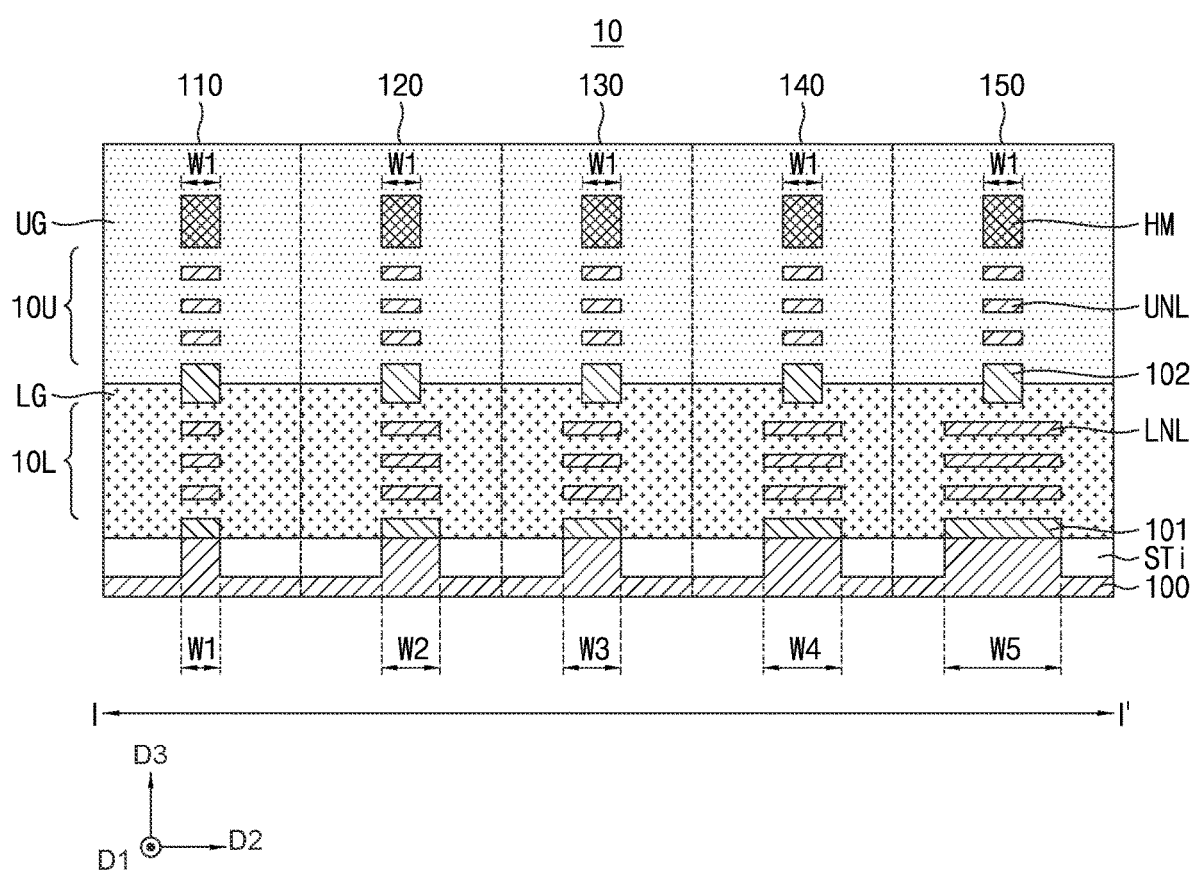
FIG. 1B illustrates a cross-sectional view of a multi-stack semiconductor device taken along a line X-X' in FIG. 1A.

FIG. 1A illustrates a top plan view of a multi-stack semiconductor device, according to an embodiment, and FIG. 1B illustrates a cross-sectional view of a multi-stack semiconductor device taken along a line I-I' in FIG. 1A. It is noted that FIG. 1A is a semi-transparent top plan view of the multi-stack semiconductor device.

Referring to FIGS. 1A and 1B, a multi-stack semiconductor device 10 includes $1^{st}$ to $5^{th}$ multi-stack nanosheet structures 110-150 arranged in a $1^{st}$ row and $6^{th}$ to $10^{th}$ multi-stack nanosheet structures 160-200 also arranged in a $2^{nd}$ row on a substrate 100 in a D1 direction, which is a channel width direction, according to an embodiment. However, the number of the multi-stack nanosheet structures in one row is not limited to five as shown in FIG. 1A, but may be more or less than five, according to embodiments. The number of rows is also not limited to two as shown in FIG. 1A but may be more or less than two, according to embodiments. Herebelow, the descriptions are directed to only the $1^{st}$ to $5^{th}$ multi-stack nanosheet structures 110-150. However, it is understood that the same descriptions may apply to the $6^{th}$ to $10^{th}$ multi-stack nanosheet structures 160-200.

Each of the $1^{st}$ to $5^{th}$ multi-stack nanosheet structures 110-150 includes a lower nanosheet stack 10L and an upper nanosheet stack 10U formed above the lower nanosheet stack 10L in a D3 direction, which is a channel height direction, perpendicular to the D1 direction. The lower nanosheet stack 10L is formed on the substrate 100 with a $1^{st}$ isolation layer 101 therebetween, and the upper nanosheet stack 10U is formed on the lower nanosheet stack 10L with a $2^{nd}$ isolation layer 102 therebetween. Any two adjacent lower nanosheet stacks 10L of the $1^{st}$ to $5^{th}$ multi-stack nanosheet structures 110-150 may be isolated from each other by a shallow trench isolation (STI) region.

It is noted here that, although widths of the lower nanosheet stacks 10L between adjacent two multi-stack nanosheet structures, for example, the $1^{st}$ and $6^{th}$ multi-stack nanosheet structures, may be the same, the widths of the lower nanosheet stack 10L vary between the $1^{st}$ to $5^{th}$ multi-stack nanosheet structures 110-150, according to embodiments, as will be described later in detail.

The lower and upper nanosheet stacks 10L and 10U respectively form lower and upper nanosheet transistors. On the upper nanosheet stack 10U is formed a hardmask layer HM that remains after pattering the upper and lower nanosheet stacks 10U and 10L during the operations of manufacturing the multi-stack semiconductor device 10.

FIG. 1B shows that each of the $1^{st}$ to $10^{th}$ multi-stack nanosheet structures 110-200 includes one lower nanosheet stack and one upper nanosheet stack on the substrate 100. However, two or more lower nanosheet stacks and two or more upper nanosheet stacks may be formed on the substrate 100 to achieve each of the $1^{st}$ to $10^{th}$ multi-stack nanosheet structures 110-200, according to embodiments.

The substrate 100 may be a bulk semiconductor substrate, for example, a semiconductor-on-insulator (SOI) substrate including silicon (Si) or its compound, not being limited thereto. The $1^{st}$ isolation layer 101 isolating the lower nanosheet stack 10L from the substrate 100 and the $2^{nd}$ isolation layer 102 isolating the upper nanosheet stack 10U from the lower nanosheet stack 10L may be formed of silicon oxide (SiO) or silicon nitride (SiN), not being limited thereto. The STI region may also be formed of SiO or SiN, not being limited thereto. The hardmask layer HM may be formed of SiO, SiN, silicon dioxide ($SiO_2$), silicon oxynitride (SiON), or an oxide/nitride stack, not being limited thereto.

The lower nanosheet stack 10L of each of the multi-stack nanosheet structures 110-150 includes a plurality of lower nanosheet layers LNL serving as a channel of the lower nanosheet stack 10L, and these lower nanosheet layers LNL are surrounded by a lower gate structure LG. Lower source/drain regions LS/D may be formed at both ends of the lower nanosheet layers LNL in a D2 direction, which is a channel length direction, perpendicular to the D1 and D3 directions. The lower source/drain region LS/D may be isolated from adjacent lower source/drain region LS/D by an interlayer dielectric (ILD) structure formed of SiO or SiN, not being limited thereto.

The upper nanosheet stack 10U of each of the multi-stack nanosheet structures 110-150 also includes a plurality of nanosheet layers UNL serving as a channel of the upper nanosheet stack 10U, and these upper nanosheet layers UNE are surrounded by an upper gate structure UG. Upper source/drain regions US/D are formed at both ends of the upper nanosheet layers UNL in the D2 direction. The upper source/drain region US/D may be isolated from adjacent upper source/drain region US/D by the ILD structure.

The lower and upper nanosheet layers LNL and UNL may be formed of Si when the corresponding nanosheet stack is an n-type nanosheet transistor, or silicon germanium (SiGe) when the corresponding nanosheet stack is a p-type nanosheet transistor. In the present embodiment, the lower nanosheet stacks 10L may be all p-type nanosheet transistors, and the upper nanosheet stacks 10U may be all n-type nanosheet transistors. However, the inventive concept is not limited thereto. According to embodiments, any one of the lower nanosheet stacks 10L may be formed as an n-type nanosheet transistor, and any one of the upper nanosheet stacks 10U may be formed as a p-type nanosheet transistor.

FIG. 1B shows that each of the lower and upper nanosheet stacks 10L and 10U of each of the multi-stack nanosheet structure 110-150 includes three nanosheet layers. However, the number of nanosheet layers included in each of the lower and upper nanosheet stacks 10L and 10U may be more or less than three, according to embodiments. Further, the number of nanosheet layers of the lower nanosheet stack 10L may be different from that of the upper nanosheet stack 10U, according to embodiments.

FIG. 1A shows that the $1^{st}$ to $5^{th}$ multi-stack nanosheet structures 110-150 are separated from the $6^{th}$ to $10^{th}$ multi-stack nanosheet structures 160-200 by a fin-cut region FC. However, the $1^{st}$ to $10^{th}$ multi-stack nanosheet structures 110-200 may be obtained from a same substrate, that is, the substrate 100, in the operations of manufacturing the multi-stack semiconductor device 10.

FIGS. 1A and 1B show that the lower gate structures LG of the $1^{st}$ to $5^{th}$ multi-stack nanosheet structure 110-150 are connected to one another as a continuous single gate structure. This is because these lower gate structures LG may be formed by the same deposition process replacing a prior-formed single continuous lower dummy gate structure at the same time. However, according to embodiments, the lower gate structure LG of any one of the multi-stack nanosheet structures 110-150 may be formed separately from the lower gate structure LG of an adjacent one of the multi-stack nanosheet structures 110-150, and may be isolated therefrom by an ILD structure. Also, as noted above, any two adjacent lower gate structures LG may be different type gate structures, that is, n-type and p-type.

Similarly, the upper gate structures UG of the $1^{st}$ to $5^{th}$ multi-stack nanosheet structure 110-150 are connected to one another as a continuous single gate structure because these upper gate structures UG may also be formed by the same deposition process replacing a prior-formed single continuous upper dummy gate structure at the same time. However, according to embodiments, the upper gate structure UG of any one of the multi-stack nanosheet structures 110-150 may be formed separately from the upper gate structure UG of an adjacent one of the multi-stack nanosheet structures 110-150, and may be isolated therefrom by an ILD structure. Also, as noted above, any two adjacent upper gate structures UG may be different type gate structures, that is, n-type and p-type.

The lower and upper gate structures LG and UG may include a work function metal (WFM) such as Cu, Al, Ti, Ta, W, Co, TiN, WN, TiAl, TiAlN, TaN, TiC, TaC, TiAlC, TaCN, TaSiN, and/or a combination thereof, not being limited thereto. However, an n-type gate structure and a p-type gate structure have different materials or different material compositions.

As briefly described above, FIGS. 1A and 1B show that the lower nanosheet stacks 10L of the $1^{st}$ to $5^{th}$ multi-stack nanosheet structures 110-150 have different widths W1, W2, W3 (equal to W2), W4 and W5, although the upper nanosheet stacks 10U of the $1^{st}$ to $5^{th}$ multi-stack nanosheet structures 110-150 have the same width W1. Here, the width of a nanosheet stack may correspond to or may be the same as the width of each nanosheet layer surrounded by a gate structure in the nanosheet stack.

Specifically, the lower and upper nanosheet stacks 10L and 10U of the $1^{st}$ multi-stack nanosheet structure 110 have the same width W1. However, the lower nanosheet stack 10L of the $2^{st}$ multi-stack nanosheet structure 120 has the width W2 which is greater than the width W1 of the lower nanosheet stack 10L of the $1^{st}$ multi-stack nanosheet structure. The width difference between the widths W2 and W1 may be a thickness TH1 of a $1^{st}$ spacer layer 115 that is used to form the multi-stack semiconductor device 10, as will be described later. In the $2^{nd}$ multi-stack nanosheet structure 120, the lower nanosheet stack 10L may also be wider than the upper nanosheet stack 10U by the same thickness TH1.

The $3^{rd}$ multi-stack nanosheet structure 130 is mirror-symmetric to the $2^{st}$ multi-stack nanosheet structure 120, and thus, the width W3 of the lower nanosheet stack 10L of the $3^{rd}$ multi-stack nanosheet structure 130 is the same as the width W2 of the lower nanosheet stack 10L of the $2^{st}$ multi-stack nanosheet structure 120. In the $3^{rd}$ multi-stack nanosheet structure 130, the lower nanosheet stack 10L may also be wider than the upper nanosheet stack 10U by the same thickness TH1.

The lower nanosheet stack 10L of the $4^{th}$ multi-stack nanosheet structure 140 has the width W4 which is greater than the width W2 (W3) of the lower nanosheet stacks 10L of the $2^{nd}$ and $3^{rd}$ multi-stack nanosheet structure 120 and 130. The width difference between the widths W4 and W2 (W3) may be the thickness TH1. In the $4^{th}$ multi-stack nanosheet structure 140, the lower nanosheet stack 10L may be wider than the upper nanosheet stack 10U by twice the thickness TH1.

The lower nanosheet stack 10L of the $5^{th}$ multi-stack nanosheet structure 150 has the width W5 which is greater than the width W4 of the lower nanosheet stacks 10L of the $4^{th}$ multi-stack nanosheet structure 140. The width difference between the widths W5 and W4 may be twice the thickness TH2 of a $2^{nd}$ spacer layer 125 that is also used to form the multi-stack semiconductor device 10, as will be described later. Thus, the width W5 may be greater than the width W2 or W3 by the thickness TH1 plus twice the thickness TH2. In the $5^{th}$ multi-stack nanosheet structure 110, the lower nanosheet stack 10L may be wider than the upper nanosheet stack 10U by the same thickness of twice the thickness TH1 plus twice the thickness TH2.

In the above embodiments, the width differences between the lower nanosheet stacks 10L of the $1^{st}$ multi-stack nanosheet structure 110, each of the $2^{nd}$ and $3^{rd}$ multi-stack nanosheet structures 120 and 130, the $4^{th}$ multi-stack nanosheet structure 140, and the $5^{th}$ multi-stack nanosheet structure 150 are set to the thickness TH1, the thickness TH1, and the thickness TH1 plus twice the thickness TH2 as describe above. However, the inventive concept is not limited thereto, and thus, various different width differences such as three times the TH1, three times the TH2, etc. may also be implemented, according to embodiments.

Further, in the above embodiments, the upper nanosheet stacks 10U of the $1^{st}$ to $5^{th}$ multi-stack nanosheet structure 110-150 have the same width W1. However, according to an embodiment, these upper nanosheet stack 10U may also be formed to have different widths by using different-width photoresist patterns during the formation of the multi-stack semiconductor device 10.

Moreover, even if the inventive concept is described with the embodiments of multi-stack nanosheet structures including nanosheet structures on both of lower stacks and upper stacks as shown in FIGS. 1A and 1B, the nanosheet structures on the upper stacks may be implemented by a different type of transistor structure such as a finFET structure formed of at least one fin structure as a current channel to achieve a hybrid multi-stack semiconductor device, according to embodiments.

FIGS. 2A-2I illustrate a method of manufacturing a multi-stack semiconductor device, according to embodiments. This method is described in reference to a flowchart shown in FIG. 3.

Referring to FIG. 2A, a set of lower nanosheet layers LNL and lower sacrificial layers LSL, a set of upper nanosheet layers UNL and upper sacrificial layers USL, a $1^{st}$ hardmask layer HM1, a dummy gate structure DG and a plurality of photoresist patterns PR1-PR5 are formed in this order on a substrate 100, according to an embodiment (S10)

The lower and upper sacrificial layers LNL and USL shown in FIG. 2A are to be replaced by respective gate materials to form part of gate structures of lower and upper nanosheet stacks 10L and 10U, respectively, in a later operation. FIG. 2A further shows that a $1^{st}$ isolation layer is interposed between a lowermost lower sacrificial layer LSL and the substrate 100, and a $2^{nd}$ isolation layer 102 is interposed between a lowermost upper sacrificial layer USL and an uppermost lower nanosheet layer LNL, for respective isolation purposes.

The lower nanosheet layers LNL, the lower sacrificial layers LSL, the upper nanosheet layers UNL and the upper sacrificial layers USL may be epitaxially grown from the substrate 100 formed of silicon (Si) or its compound in an alternating manner until a desired number and thickness of the layers are obtained. The lower nanosheet layers LNL may be formed of Si while the lower sacrificial layers LSL may be formed of SiGe when the lower nanosheet layers LNL are to form one or more NFETs in a later operation. In contrast, the lower nanosheet layers LNL may be formed of SiGe while the lower sacrificial layers LSL may be formed of Si when the lower nanosheet layers LNL are to form one or more PFETs. During the epitaxial growth of these nanosheet layers LNL and UNL from the substrate 100, the lower nanosheet layers LNL may be doped by n-type dopants (e.g., arsenic, phosphorous, etc.) or p-type dopants (e.g., boron, gallium, etc.) depending on the type of FET to be formed in a later operation.

In FIG. 2A, three lower nanosheet layers LNL and three upper nanosheet layers UNL are formed. However, the number of these nanosheet layer are not limited three, according to embodiments. Further, although FIG. 2A shows that only one set of lower nanosheet layers LNL and lower sacrificial layers LSL, and only one set of upper nanosheet layers UNL and upper sacrificial layers USL on the substrate 100, more than one set of lower nanosheet layers LNL and lower sacrificial layers LSL and/or more than one set of upper nanosheet layers UNL and upper sacrificial layers USL may be formed on the substrate 100, according to embodiments.

FIG. 2A further shows that the $1^{st}$ hardmask layer HM1 is formed on the upper-most upper nanosheet layer UNL, a dummy gate structure DG is formed on the $1^{st}$ hardmask layer HM1, and five $1^{st}$ photoresist patterns PR1-PR5, each of which has a width W1 in the D1 direction, are formed on the dummy gate structure DG. The $1^{st}$ hardmask layer HM1 may be formed of SiO, SiN, silicon dioxide ($SiO_2$), silicon oxynitride (SiON), or an oxide/nitride stack, not being limited thereto. The dummy gate structure DG may be formed of amorphous silicon (a-Si) or polycrystalline silicon (poly-Si), not being limited thereto. The $1^{st}$ photoresist patterns PR1-PR5 may be formed by patterning an organic polymer resin containing a photoactive (light sensitive) material through a lithography process. The five $1^{st}$ photoresist patterns PR1-PR5 are formed on the dummy gate structure DG and the $1^{st}$ hardmask layer HM1 to pattern five multi-stack nanosheet structures, that is, $1^{st}$ to $5^{th}$ multi-stack nanosheet structures 110-150, on the substrate in a later operation. However, the number of the $1^{st}$ photoresist patterns is not limited five, and may be more or less than five, depending on the number of multi-stack nanosheet structures to be patterned on the substrate 100.

Referring to FIG. 2B, the upper nanosheet layers USL and the upper sacrificial layers USL with the $1^{st}$ hardmask layer HM1 and the dummy gate structure DG thereon are patterned according to the five $1^{st}$ photoresist patterns PR1-PR5, thereby to obtain $1^{st}$ to $5^{th}$ upper nanosheet stacks 10U1-10U5 on the $2^{nd}$ isolation layer 102, according to an embodiment (S20).

The patterning operation employed here may be, for example, subtractive dry etching and/or reactive ion etching (RIE), according to an embodiment. Along with the $1^{st}$ to $5^{th}$ upper nanosheet stacks 10U1-10U5, this patterning operation generates a space S1 at a left side of the $1^{st}$ upper nanosheet stack 10U1, a $1^{st}$ trench T1 between the $1^{st}$ and $2^{nd}$ upper nanosheet stacks 10U1 and 10U2, a $2^{nd}$ trench T2 between the $2^{nd}$ and $3^{rd}$ upper nanosheet stacks 10U2 and 10U3, a $3^{rd}$ trench T3 between the $3^{rd}$ and $4^{th}$ upper nanosheet stacks 10U3 and 10U4, a $4^{th}$ trench T4 between the $4^{th}$ and $5^{th}$ upper nanosheet stacks 10U4 and 10U5, and a $2^{nd}$ space S2 at a right side of the $5^{th}$ upper nanosheet stack 10U5. Further, as a result of the patterning in this operation, the $2^{nd}$ isolation layer 102 is exposed upward between the $1^{st}$ to $5^{th}$ upper nanosheet stacks 10U1-10U5 through the $1^{st}$ to $4^{th}$ trenches T1-T4 and $1^{st}$ to $2^{nd}$ spaces S1-S2. After obtaining the upper nanosheet stacks 10U1-10U5 arranged in a row on the $2^{nd}$ isolation layer 102, the $1^{st}$ photoresist patterns PR1-PR5 may be removed.

Each of the upper nanosheet stacks 10U1-10U5 includes the upper nanosheet layers UNL, the upper sacrificial layers USL, the $1^{st}$ hardmask layer HM1, and the dummy gate structure DG that were patterned according to the $1^{st}$ photoresist patterns PR1-PR5. By this patterning operation, the shape of the $1^{st}$ photoresist patterns PR1-PR5 including their width W1 in the D1 direction is transferred down to the upper nanosheet stacks 10U1-10U5 obtained therebelow so that each of the upper nanosheet stacks 10U1-10U5 can have the same width W1 in the D1 direction, which is a channel width direction. However, as described earlier in reference to FIGS. 1A and 1B, the $1^{st}$ to $5^{th}$ upper nanosheet stacks 10U1-10U5 may be patterned to have different widths when the $1^{st}$ photoresist patterns PR1-PR5 are formed to have different widths in the previous operation S10 (FIG. 2A).

Figure 2C:
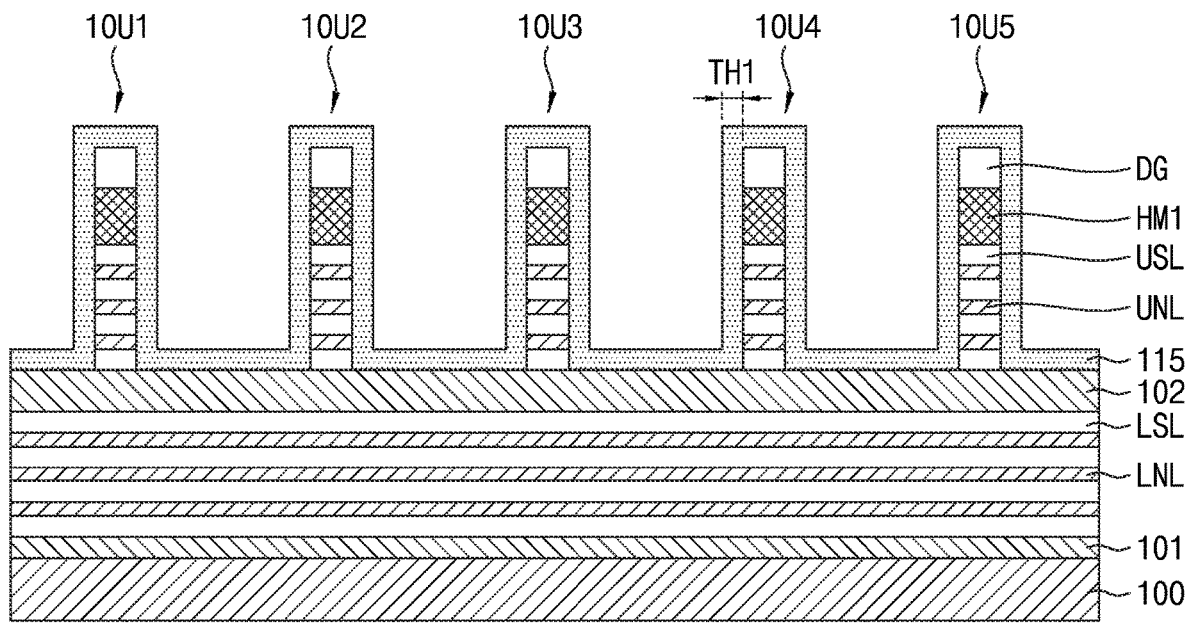
Figure 3:
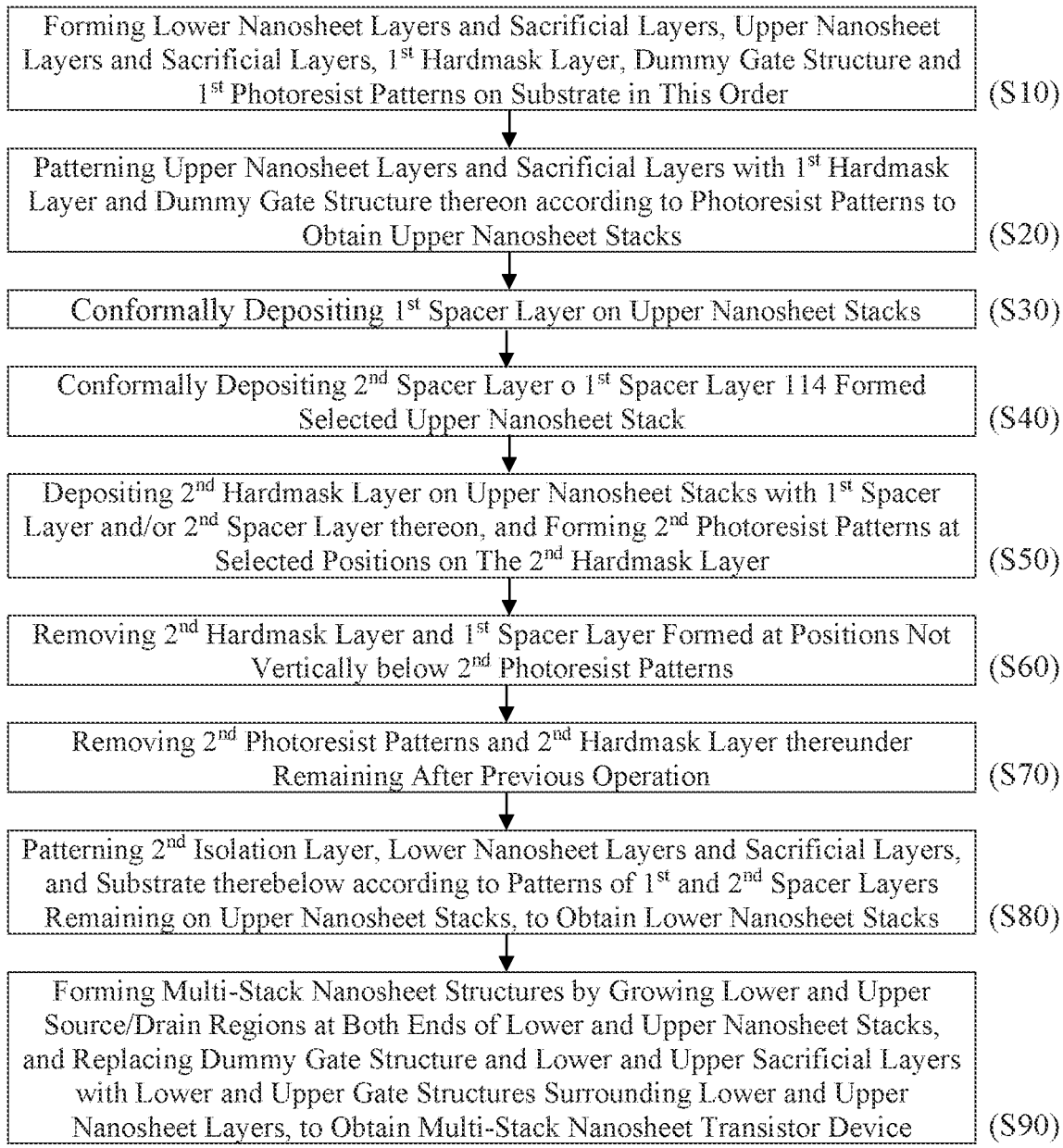
FIG. 3 illustrates a flowchart of manufacturing a multi-stack semiconductor device, according to embodiments

Referring to FIG. 2C, a $1^{st}$ spacer layer 115 is conformally deposited on outer surfaces of the upper nanosheet stacks 10U1-10U5 and on the $2^{nd}$ isolation layer 102 exposed between the upper nanosheet stacks 10U1-10U5, according to an embodiment (S30).

In this conformal deposition operation, the $1^{st}$ spacer layer 115 may be deposited using a thin film deposition technique of atomic layer deposition (ALD) so that the $1^{st}$ spacer layer 115 can have a uniform thickness TH1 along the outer surfaces of the upper nanosheet stacks 10U1-10U5 and the $2^{nd}$ isolation layer 102 exposed between the upper nanosheet stacks 10U1-10U5, according to an embodiment. The $1^{st}$ spacer layer 115 may also be formed through a sidewall image transfer (SIT) spacer formation process followed by reactive ion etching (RIE) of a deposited spacer material, according to an embodiment.

As described above in reference to FIGS. 1A and 1B, the thickness TH1 of the $1^{st}$ spacer layer 115 defines a width difference between each of the upper nanosheet stacks 10U1-10U5 and a corresponding lower nanosheet stack to be obtained therebelow in a later operation, according to an embodiment.

The $1^{st}$ spacer layer 115 may be formed of a material including SiO, $SiO_2$, SiN, silicon carbon nitride (SiCN), silicon carbon oxynitride (SiCON) or silicon boro carbonitride (SiBCN), not being limited thereto, as long as the material has etch selectivity against a material or layer deposited above the $1^{st}$ spacer layer 115 in a later operation.

Figure 2D:
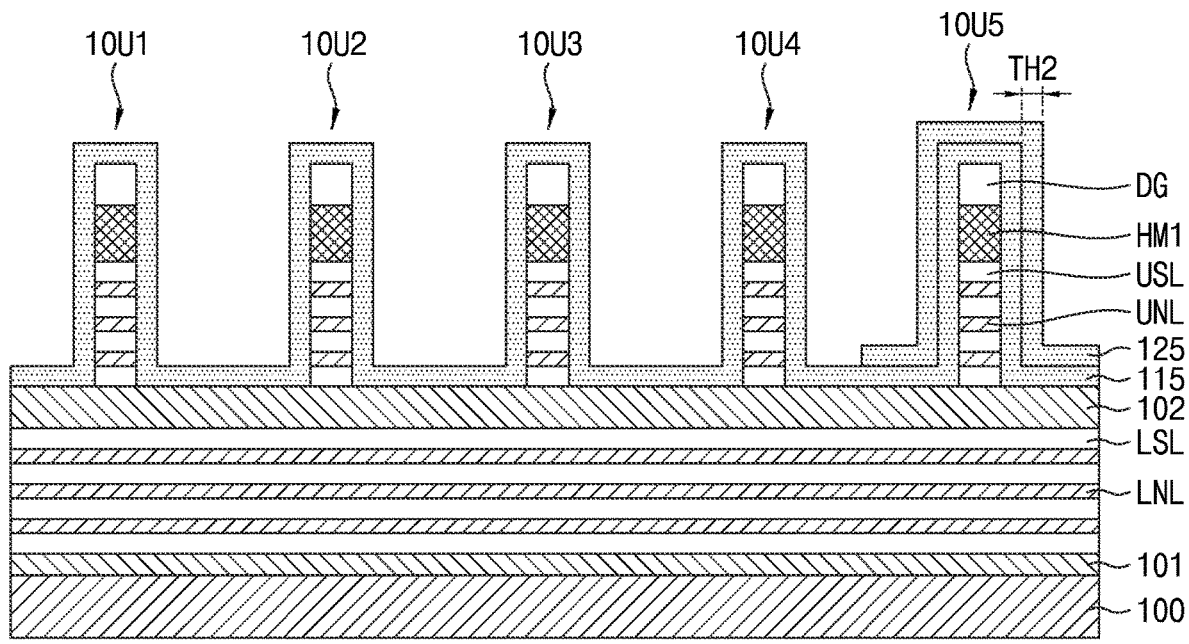

Referring to FIG. 2D, a $2^{nd}$ spacer layer 125 is conformally deposited on outer surface the $1^{st}$ spacer layer 114 formed on the $5^{th}$ upper nanosheet stack 10U5 among the $1^{st}$ to $5^{th}$ upper nanosheet stacks 10U1-10U5, according to an embodiment (S40). The same conformal deposition used to deposit the $1^{st}$ spacer layer 115 may be performed on the $1^{st}$ spacer layer 115 on the $5^{th}$ upper nanosheet stack 10U5 so that the $2^{nd}$ spacer layer 125 can have a uniform thickness TH2 along the outer surfaces of the $1^{st}$ spacer layer 115 on the upper nanosheet stack 10U5, according to an embodiment.

As described above in reference to FIGS. 1A and 1B, the thickness TH2 defines a width difference between the $5^{th}$ upper nanosheet stack 10U5 and a corresponding lower nanosheet stack to be obtained therebelow in a later operation, according to an embodiment.

The material forming the $2^{nd}$ spacer layer 125 may be the same as that of the $1^{st}$ spacer layer 115 as long as the material has etch selectivity against a material or layer deposited above the $2^{nd}$ spacer layer 125 in a later operation.

The deposition of the $2^{nd}$ spacer layer 125 may be performed on the $1^{st}$ spacer layer 115 formed on the $5^{th}$ upper nanosheet stack 10U5 such that the $2^{nd}$ spacer layer 125 is extended to left and right sides of the $5^{th}$ upper nanosheet stack 10U5 to cover portions of the $1^{st}$ spacer layer 115 formed on the $2^{nd}$ isolation layer 102 in a right portion of the $4^{th}$ trench T4 and in the $2^{nd}$ space S2 as shown in FIG. 2D, according to an embodiment.

Figure 2E:
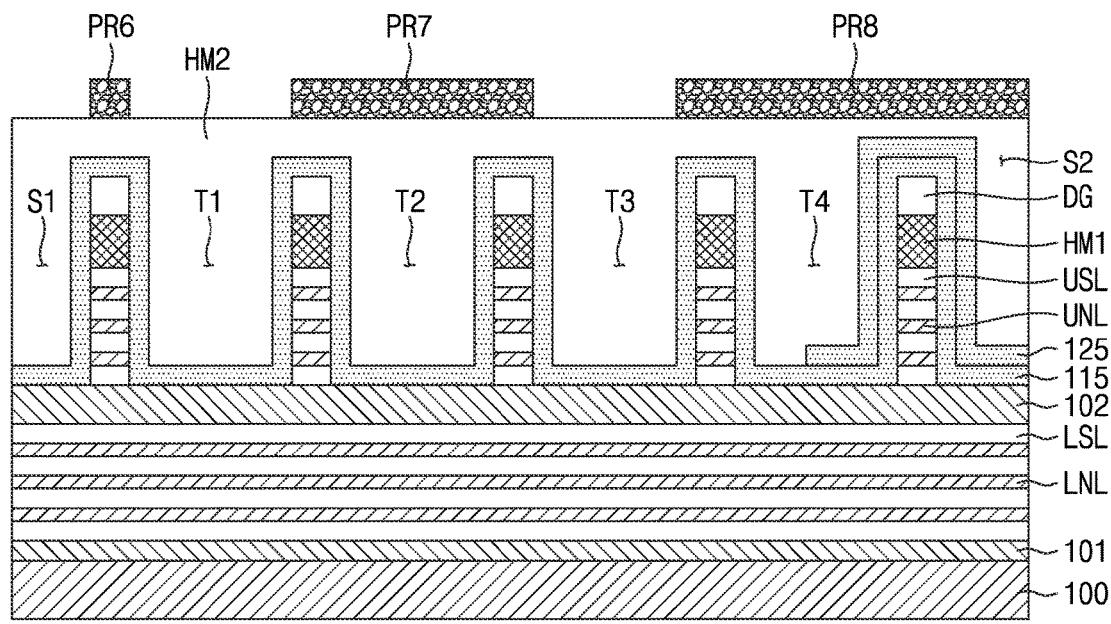

Referring to FIG. 2E, a $2^{nd}$ hardmask layer HM2 is deposited on the $1^{st}$ to $5^{th}$ upper nanosheet stacks 10U1-10U5 with the $1^{st}$ spacer layer 115 and/or the $2^{nd}$ spacer layer 125 thereon, and three $2^{nd}$ photoresist patterns PR6-PR8 are formed at selected positions on the $2^{nd}$ hardmask layer HM2, according to an embodiment (S50).

The $2^{nd}$ hardmask layer HM2 may be deposited on the $1^{st}$ spacer layer 115 formed on the $1^{st}$ to $4^{th}$ upper nanosheet stacks 10U1-10U4 and the $2^{nd}$ isolation layer 102 therebetween, and the $2^{nd}$ spacer layer 125 formed on the $1^{st}$ spacer layer 115 on the $5^{th}$ upper nanosheet stack 10U5, for example, by at least one of physical vapor deposition (PVD), chemical vapor deposition (CVD), plasma-enhanced chemical vapor deposition (PECVD) and flowable CVD, not being limited thereto.

On the $2^{nd}$ hardmask layer HM2, the $2^{nd}$ photoresist patterns PR6-PR8 may be formed by patterning an organic polymer resin containing a photoactive (light sensitive) material through a lithography process like the formation of the $1^{st}$ to $5^{th}$ photoresist patterns PR1-PR5 in the previous operation S10 (FIG. 2A). Before the $2^{nd}$ photoresist patterns PR6-PR8 are formed and patterned, the $2^{nd}$ hardmask layer HM2 may be planarized, for example, by a chemical-mechanical polishing (CMP) operation. The $2^{nd}$ hardmask layer HM2 may be formed of the same material forming the $1^{st}$ hardmask layer HM1. However, the material forming the $2^{nd}$ hardmask layer HM2 may have etch selectivity or a different etch rate against the $1^{st}$ spacer layer 115 and the $2^{nd}$ spacer layer 125 for a subsequent etching operation, according to an embodiment.

By the deposition of the $2^{nd}$ hardmask layer HM2 in this operation, the $1^{st}$ to $5^{th}$ upper nanosheet stacks 10U1-10U5, on which the $1^{st}$ spacer layer 115 and/or the $2^{nd}$ spacer layer 125 are formed, are covered by the $2^{nd}$ hardmask layer HM2, and the $1^{st}$ to $4^{th}$ trenches T1-T4 and the $1^{st}$ to $2^{nd}$ spaces S1-S2 defined in the previous operation S20 (FIG. 2B) are filled out by the $2^{nd}$ hardmask layer HM2.

Further, by the photoresist patterning in this operation, the $2^{nd}$ photoresist patterns PR6-PR8 are formed on the $2^{nd}$ hardmask layer HM2 at positions where the $1^{st}$ spacer layer 115 and the $2^{nd}$ spacer layer 125 formed therebelow are to be protected without being removed in the subsequent etching operation, according to an embodiment. As will be explained later, these $1^{st}$ spacer layer 115 and $2^{nd}$ spacer layer 125 may be protected so that they can be used to pattern corresponding lower nanosheet stacks in a later operation.

Specifically, the $2^{nd}$ photoresist pattern PR6 is formed on the $2^{nd}$ hardmask layer HM2 at a position vertically above the $1^{st}$ upper nanosheet stack 10U1. By the formation of the $2^{nd}$ photoresist pattern PR6 at this position, the $2^{nd}$ photoresist pattern PR6 and the $2^{nd}$ hardmask layer HM2 thereunder can protect, from the subsequent etching operation, the $1^{st}$ spacer layer 115 formed on a top surface of the $1^{st}$ upper nanosheet stack 10U1.

The $2^{nd}$ photoresist pattern PR7 is formed on the $2^{nd}$ hardmask layer HM2 at a position vertically above a top surface of the $2^{nd}$ upper nanosheet stack 10U2 through a top surface of the $3^{rd}$ upper nanosheet stack 10U3, according to an embodiment. By the formation of the $2^{nd}$ photoresist pattern PR7 at this position, the $2^{nd}$ photoresist pattern PR7 and the $2^{nd}$ hardmask layer HM2 thereunder can protect, from the subsequent etching operation, the $1^{st}$ spacer layer 115 formed on the top surface and a right side surface of the $2^{nd}$ upper nanosheet stack 10U2, the $2^{nd}$ isolation layer 102 in the $2^{nd}$ trench T2, and a left side surface and a top surface of the $3^{rd}$ upper nanosheet stack 10U3.

The $2^{nd}$ photoresist pattern PR8 is formed on the $2^{nd}$ hardmask layer HM2 at a position vertically above the $1^{st}$ spacer layer 115 formed on a left side surface of the $4^{th}$ upper nanosheet stack 10U4 through the $2^{nd}$ spacer layer extended to a right side of the $5^{th}$ upper nanosheet stack 10U5 in the $2^{nd}$ space S2. By the formation of the $2^{nd}$ photoresist pattern PR8 at this position, the $2^{nd}$ photoresist pattern PR8 and the $2^{nd}$ hardmask layer HM2 thereunder can protect, from the subsequent etching operation, the $1^{st}$ spacer layer 115 formed on the entire 4th upper nanosheet stack 10U4, the $1^{st}$ and $2^{nd}$ spacer layers 115 and 125 formed on the $2^{nd}$ isolation layer 102 in the $4^{th}$ trench T4, and the $1^{st}$ and $2^{nd}$ spacer layers 115 and 125 formed on the entire $5^{th}$ upper nanosheet stack 10U5 and extended to the $2^{nd}$ side surface S2 on the $2^{nd}$ isolation layer 102.

As will be described later, a lower nanosheet stack to be formed below an upper nanosheet stack with the protected $1^{st}$ spacer layer 115 and/or the protected $2^{nd}$ spacer layer 125 is to have a wider width than a lower nanosheet stack to be formed below an upper nanosheet stack without the protected $1^{st}$ spacer layer 115 or without both the protected $1^{st}$ spacer layer 115 and the protected $2^{nd}$ spacer layer 125. The width difference may be the thickness TH1 of the $1^{st}$ spacer layers 115 and/or the thickness TH2 of the $2^{nd}$ spacer layer 125 described in reference to FIGS. 1A and 1B. As will also be described later, a lower nanosheet stack to be formed below an upper nanosheet stack with the protected $1^{st}$ spacer layer 115 and/or the protected $2^{nd}$ spacer layer 125 is to have a wider width than an upper nanosheet stack formed thereabove by the same thickness TH1 of the $1^{st}$ spacer layers 115 and/or the thickness TH2 of the $2^{nd}$ spacer layer 125 described in reference to FIGS. 1A and 1B.

In this regard, the $2^{nd}$ photoresist patterns PR6-PR8 described above may not be formed at the positioned as shown in FIG. 2E. Instead, the $2^{nd}$ photoresist patterns PR6-PR8 may be formed at different positions as long as the $1^{st}$ spacer layer 115 and the $2^{nd}$ spacer layer 125 provided to arrange so that the above width difference can be protected by the $2^{nd}$ photoresist patterns PR6-PR8 and the $2^{nd}$ hardmask layer HM2 thereunder.

Figure 2F:
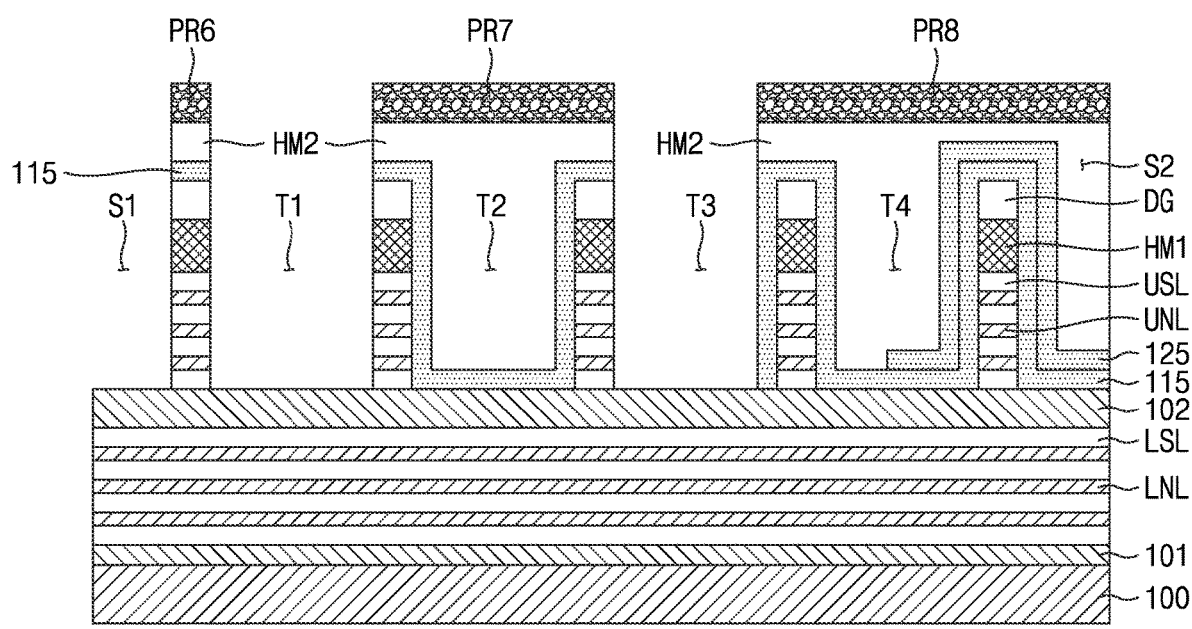

Referring to FIG. 2F, the $2^{nd}$ hardmask layer HM2 and the $1^{st}$ spacer layer 115 formed at positions not vertically below the $2^{nd}$ photoresist patterns PR6-PR8 are removed, according to an embodiment (S60). For this operation, anisotropic dry etching and/or wet etching may apply to the $2^{nd}$ hardmask layer HM2 and the $1^{st}$ spacer layer 115, according to an embodiment.

This etching operation removes the $1^{st}$ spacer layer 115 formed on the $2^{nd}$ isolation layer 102 in the $1^{st}$ space S1, left and right side surfaces of the $1^{st}$ upper nanosheet stack 10U1, the $2^{nd}$ isolation layer 102 in the $1^{st}$ trench T1, a left side surface of the $2^{nd}$ upper nanosheet stack 10U2, a right side surface of the $3^{rd}$ upper nanosheet stack 10U3, and the $2^{nd}$ isolation layer 102 in the $3^{rd}$ trench T3.

Figure 2G:
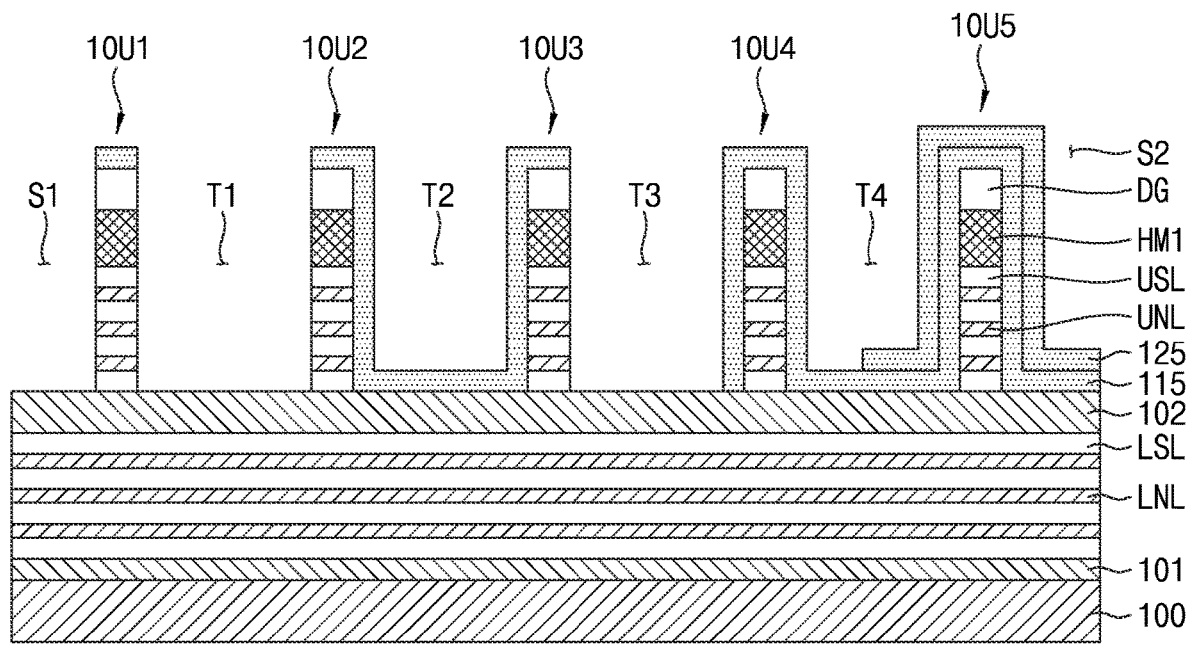

Referring to FIG. 2G, the $2^{nd}$ photoresist patterns PR6-PR8 and the $2^{nd}$ hardmask layer HM2 thereunder remaining after the previous etching operation S60 (FIG. 2F) are removed, according to an embodiment (S70). For this removal operation, ashing and/or wet etching may be used to entirely remove the $2^{nd}$ hardmask layer HM2 as well as the $2^{nd}$ photoresist patterns PR6-PR8, according to an embodiment.

The operation of removing the $2^{nd}$ photoresist pattern PR6 and the $2^{nd}$ hardmask layer HM2 remaining thereunder exposes the $1^{st}$ spacer remaining on the top surface of the $1^{st}$ upper nanosheet stack 10U1.

The operation of removing the $2^{nd}$ photoresist pattern PR7 and the $2^{nd}$ hardmask layer HM2 remaining thereunder exposes the $1^{st}$ spacer layer 115 formed on the top surface and the right side surface of the $2^{nd}$ upper nanosheet stack 10U2, the $2^{nd}$ isolation layer 102 in the $2^{nd}$ trench T2, and the left side surface and the top surface of the $3^{rd}$ upper nanosheet stack 10U3.

The operation of removing the $2^{nd}$ photoresist pattern PR8 exposes the $1^{st}$ spacer layer 115 formed on the top surface and the left and right side surfaces of the $4^{th}$ upper nanosheet stack 10U4, the $1^{st}$ and $2^{nd}$ spacer layer 115 and 125 formed on the $2^{nd}$ isolation layer 102 in the $4^{th}$ trench T4, and the $2^{nd}$ spacer layer 125 formed on the $1^{st}$ spacer layer 115 on the top surface and the left and right side surfaces of the $5^{th}$ upper nanosheet stack 10U5, and on the $2^{nd}$ spacer layer 125 formed on the $1^{st}$ spacer layer 115 on the $2^{nd}$ isolation layer 102 in the $2^{nd}$ side surface S2.

Figure 2H:
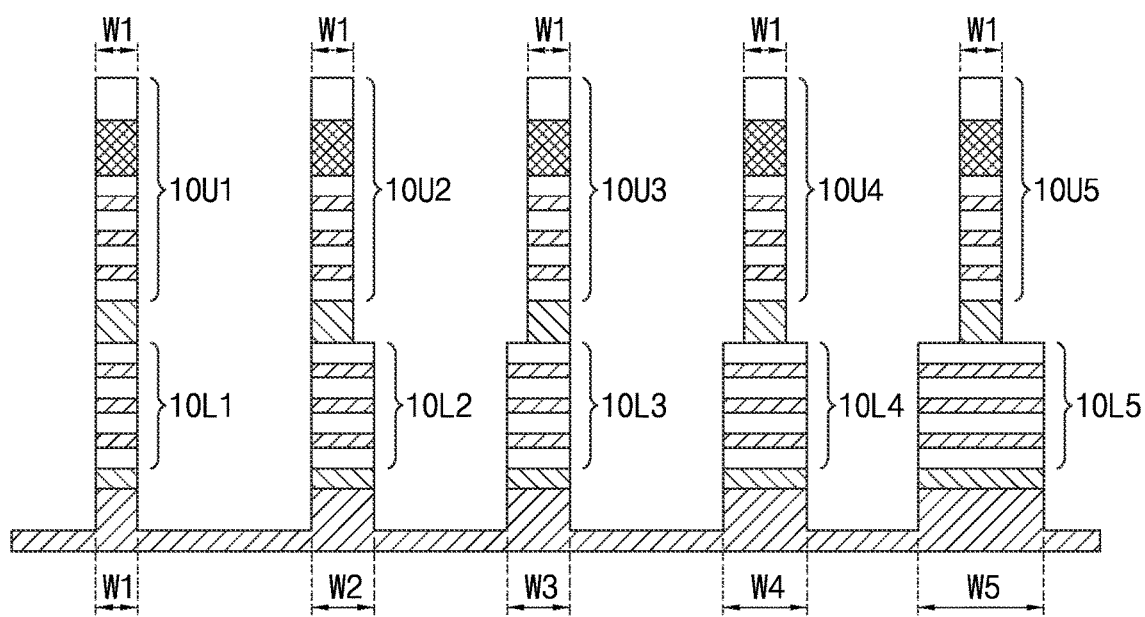

Referring to FIG. 2H, the $2^{nd}$ isolation layer 102, the lower nanosheet layers LSL and the lower sacrificial layers LSL, the $1^{st}$ isolation layer 101, and the substrate 100 therebelow are patterned, according to the patterns of the $1^{st}$ and $2^{nd}$ spacer layers 115 and 125 remaining on the $1^{st}$ to $5^{th}$ upper nanosheet stacks 10U1-10U5, to obtain lower nanosheet stacks 10L1-10L5, according to an embodiment (S80).

The operation of patterning the $1^{st}$ to $5^{th}$ lower nanosheet stacks 10L1-10L5 may be performed by subtractive dry etching and/or reactive ion etching (RIE) used to obtain the $1^{st}$ to $5^{th}$ upper nanosheet stacks 10U1-10U5 in the previous operation S20 (FIG. 2B). However, the present patterning operation may be performed using, as mask structure, the $1^{st}$ spacer layer 115 remaining on the top surface of the $1^{st}$ upper nanosheet stack 10U1, the top surface and the right side surface of the $2^{nd}$ upper nanosheet stack 10U2, the left side surface of the $3^{rd}$ upper nanosheet stack 10U3, the left side surface, the top surface and the right side surface of the $4^{th}$ upper nanosheet stack 10U4, and the left side surface, the top surface and the right side surface of the $5^{th}$ upper nanosheet stack 10U5. Thus, prior to patterning the $1^{st}$ to $5^{th}$ lower nanosheet stacks 10L1-10L5, preliminary etching may remove the $1^{st}$ spacer layer 115 formed on the $2^{nd}$ isolation layer in the $2^{nd}$ trench T2, the $4^{th}$ trench T4 and the $2^{nd}$ space S2, and the $2^{nd}$ spacer layer 125 on the $1^{st}$ spacer layer 115 in the $4^{th}$ trench T4 and the $2^{nd}$ space S2. However, the preliminary etching does not remove the $1^{st}$ spacer layer 115 and the $2^{nd}$ spacer layer 125 remaining on the left and/or right side surfaces of the $2^{nd}$ to $5^{th}$ upper nanosheet stacks 10U2-10U5 from the previous operation S60 (FIG. 2F). This is because these remaining $1^{st}$ and $2^{nd}$ spacer layers 115 and 125 will be used to define the width difference between the $2^{nd}$ to $5^{th}$ lower nanosheet stacks 10L2-10L5 and the $2^{nd}$ to $5^{th}$ upper nanosheet stacks 10U2-10U5 formed thereabove.

Due to the remaining $1^{st}$ and $2^{nd}$ spacer layer 115 and 125 along with the $1^{st}$ to $5^{th}$ upper nanosheet stacks 10U1-10U5 as mask structure, the $1^{st}$ lower nanosheet stack 10L1 is patterned below the $1^{st}$ upper nanosheet stack 10U1 to have a same width W1 as the $1^{st}$ upper nanosheet stack 10U1, the $2^{nd}$ to $5^{th}$ lower nanosheet stacks 10L2-10L5 are patterned below the $2^{nd}$ to $5^{th}$ upper nanosheet stacks 10U2-10U5, respectively, to have greater widths W2, W3, W4 and W5, respectively, than the width W1. As described thus far, the width differences are due to the thickness TH1 of the $1^{st}$ spacer layer 115 and the thickness TH2 of the $2^{nd}$ spacer layer 125.

Specifically, the $2^{nd}$ lower nanosheet stack 10L2 has the width W2 which is greater than the width W1 of the $1^{st}$ lower nanosheet stack 10L1 by the thickness TH1 of the 1st spacer layer 115, and the same as the width W3 of the $3^{rd}$ lower nanosheet stack 10L3. Further, the $4^{th}$ lower nanosheet stack 10L4 has the width W4 which is greater than the width W3 of the $3^{rd}$ lower nanosheet stack 10L3 by the thickness TH1 of the $1^{st}$ spacer layer 115, and the $5^{th}$ lower nanosheet stack 10L5 has the width W5 which is greater than the width W4 of the $4^{th}$ lower nanosheet stack 10L4 by twice the thickness TH2 of the $2^{nd}$ spacer layer 125.

Each of the $1^{st}$ to $5^{th}$ lower nanosheet stacks 10L1-10L5 obtained in the present operation includes the lower nanosheet layers LNL and the lower sacrificial layers LSL as the $1^{st}$ to $5^{th}$ upper nanosheet stacks 10U1-10U5.

Figure 2I:
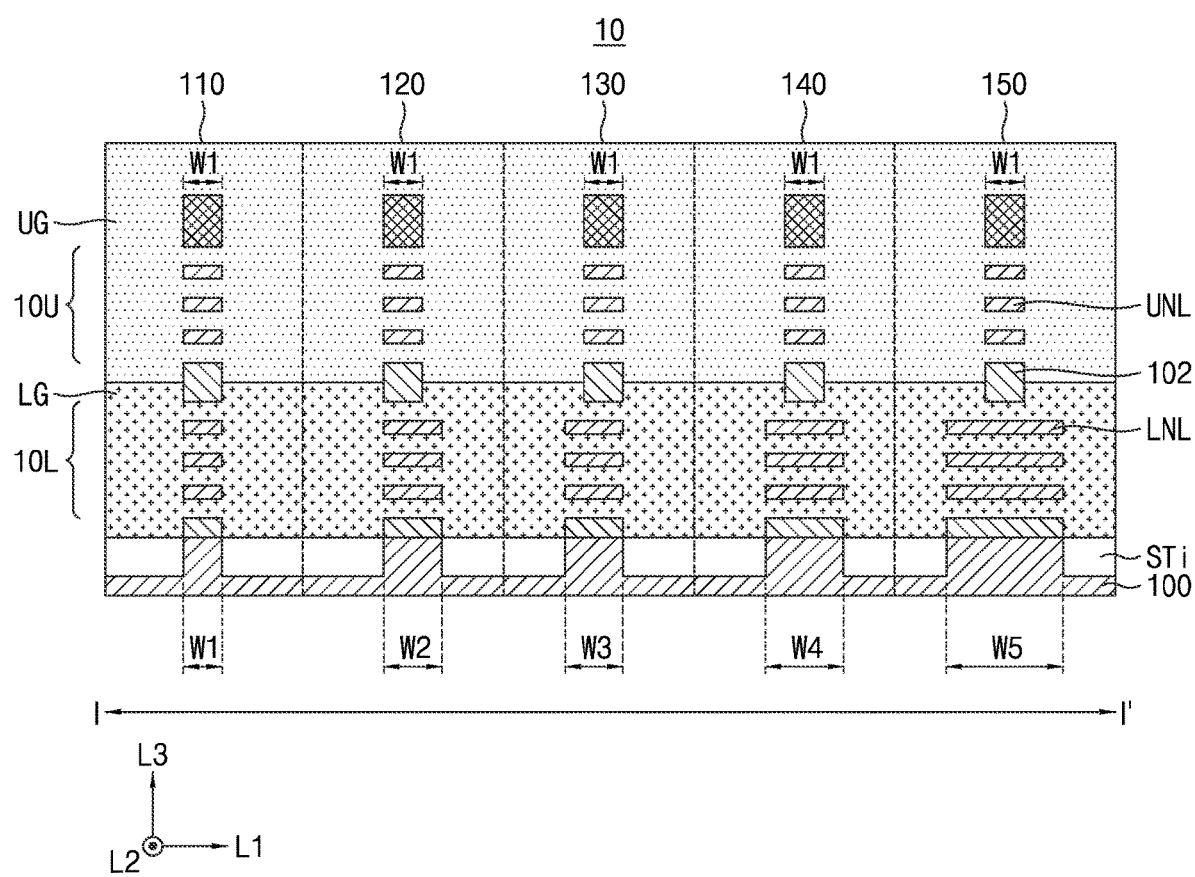

Referring to FIG. 2I, $1^{st}$ to $5^{th}$ multi-stack nanosheet structures 110-150 are formed by growing lower and upper source/drain regions (not shown) at both ends of the lower nanosheet stacks 10L1-10L5 and the upper nanosheet stacks 10U1-10U5, and replacing the dummy gate structure DG and the lower and upper sacrificial layers LSL and USL with lower and upper gate structures LG and UG surrounding the lower and upper nanosheet layers LNL and UNL, thereby to obtain a multi-stack semiconductor device 10 (S90).

Specifically, lower source/drain regions LS/D may be epitaxially grown at both ends of each of the $1^{st}$ to $5^{th}$ lower nanosheet stacks 10L1-10L5 in the D2 direction, and upper source/drain regions US/D may be epitaxially grown at both ends of each of the $1^{st}$ to $5^{th}$ upper nanosheet stacks 10U1-10U5 in the D2 direction. It is noted here that, due to the width difference described above, the lower source/drain regions LS/D formed at the $2^{nd}$ to $5^{th}$ lower nanosheet stacks 10L2-10L5 may have a greater width than those formed at the $2^{nd}$ to $5^{th}$ upper nanosheet structures 10U2-10U and those formed at the $1^{st}$ lower and upper nanosheet stacks 10L1 and 10U1. This is because a wider nanosheet stack may have a wider nanosheet layer from which a wider source/drain region may be grown.

Further, in this operation, the dummy gate structure DG and the lower and upper sacrificial layers LSL and USL included in the lower and upper nanosheet stacks 10L1-10L5 and 10U1-10U5 as shown in FIG. 2H are all removed, and replaced by the lower and upper gate structures LG and UG surrounding the lower and upper nanosheet layers LNL and UNL, respectively. The lower and upper gate structures LG and UG may be formed of a work function metal (WFM) such as Cu, Al, Ti, Ta, W, Co, TiN, WN, TiAl, TiAlN, TaN, TiC, TaC, TiAlC, TaCN, TaSiN, and/or a combination thereof, not being limited thereto. However, an n-type gate structure may be formed of a material(s) different from a p-type gate structure.

The multi-stack semiconductor device 10 obtained by this operation may have the same structure as shown in FIG. 1B.

In the above embodiments, the width differences between the $1^{st}$ to $5^{th}$ upper nanosheet stacks 10U1-10U5 and the $1^{st}$ to $5^{th}$ lower nanosheet stacks 10L1-10L5 are defined by the $1^{st}$ and $2^{nd}$ spacer layers 115 and 125 selectively formed on the $1^{st}$ to $5^{th}$ upper nanosheet stacks 10U1-10U5. An additional spacer layer may be selectively formed on the $1^{st}$ to $5^{th}$ upper nanosheet stacks 10U1-10U5 to achieve the width differences. That is, the number of the spacer layers may not be limited to two to obtain different-width lower nanosheet stacks, according to embodiments.

Due to the above embodiments, it is possible to achieve a multi-stack semiconductor device which includes channel-width-controllable multi-stack transistor structures formed on a single substrate. With this structure, different current amounts may be applied to upper- and lower-stack channels of the multi-stack semiconductor device, and more flexible MOL structure formation on the upper- and lower-stack transistor structures may be enabled.

It is also noted that the above embodiments enable simple easy formation of various different channel-width multi-stack transistor structures on a single substrate through one-time same deposition and patterning operation without need to combining different channel-width multi-stack transistor structures that are differently or separately formed.

Thus far, a method of manufacturing a multi-stack semiconductor device has been described. However, the above method may also apply to a different type of multi-stack semiconductor device, for example, which includes a nanosheet structure on a lower stack and a finFET structure on an upper stack to achieve a hybrid multi-stack semiconductor device. In this case, the finFET structure may be formed of one or more channel layers, according to embodiments.

Figure 4:
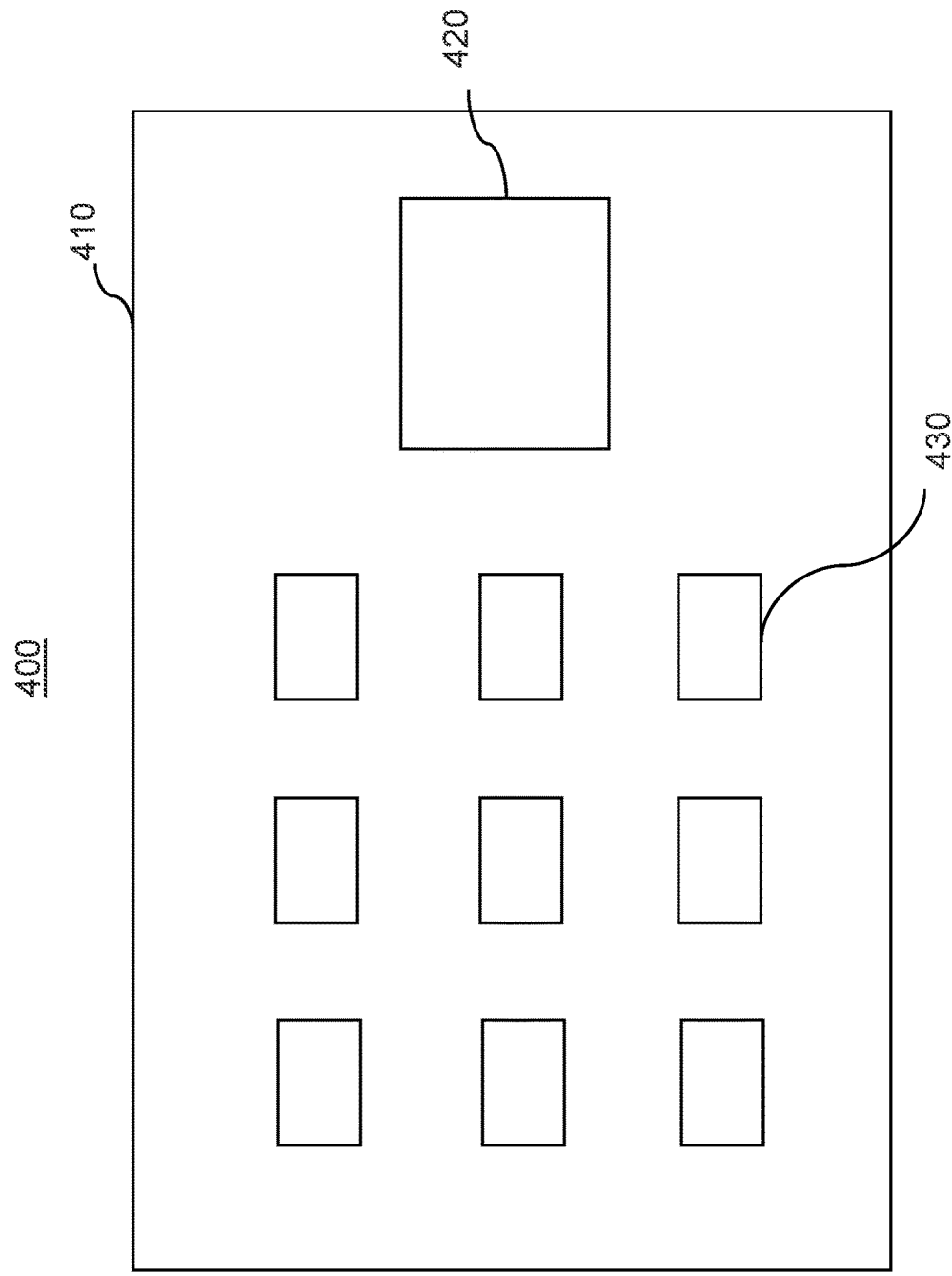
FIG. 4 illustrates a schematic plan view of a semiconductor module according to an embodiment.

Referring to FIG. 4, a semiconductor module 400 according to an embodiment may include a processor 420 and semiconductor devices 430 that are mounted on a module substrate 410. The processor 420 and/or the semiconductor devices 430 may include one or more multi-stack nanosheet structures described in the above embodiments.

Figure 5:
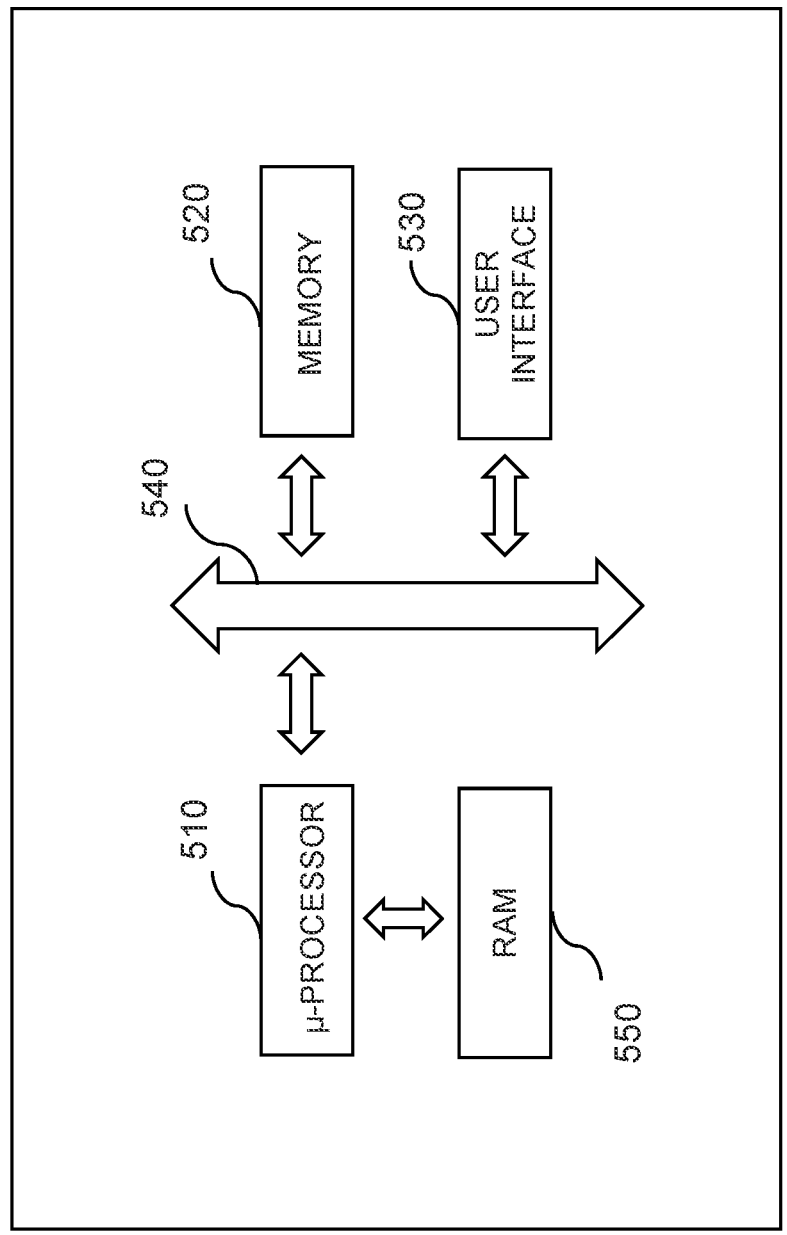
FIG. 5 illustrates a schematic block diagram of an electronic system according to an embodiment.

FIG. 5 illustrates a schematic block diagram of an electronic system according to an embodiment.

Referring to FIG. 5, an electronic system 500 in accordance with an embodiment may include a microprocessor 510, a memory 520, and a user interface 530 that perform data communication using a bus 540. The microprocessor 510 may include a central processing unit (CPU) or an application processor (AP). The electronic system 500 may further include a random access memory (RAM) 550 in direct communication with the microprocessor 610. The microprocessor 510 and/or the RAM 550 may be implemented in a single module or package. The user interface 530 may be used to input data to the electronic system 500, or output data from the electronic system 500. For example, the user interface 530 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 520 may store operational codes of the microprocessor 510, data processed by the microprocessor 510, or data received from an external device. The memory 620 may include a memory controller, a hard disk, or a solid state drive (SSD).

At least the microprocessor 510, the memory 520 and/or the RAM 550 in the electronic system 600 may include one or more multi-stack nanosheet structures described in the above embodiments.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A multi-stack semiconductor device comprising:
a substrate; and
a plurality of multi-stack transistor structures arranged on the substrate in a channel width direction,
wherein the multi-stack transistor structures comprise at least one lower transistor structure and at least one upper transistor structure stacked above the lower transistor structure,
wherein the lower and upper transistor structures comprise at least one channel layer as a current channel, and
wherein the lower transistor structures of at least two multi-stack transistor structures have different channel-layer widths such that a width of a channel layer of a lower transistor structure is different from a width of a channel layer of another lower transistor structure, among the lower transistor structures.

2. The multi-stack semiconductor device of claim 1,
wherein the upper transistor structures of the multi-stack transistor structures have a same channel-layer width or different channel-layer widths.

3. The multi-stack semiconductor device of claim 1,
wherein the lower transistor structure of at least one multi-stack transistor structure has a greater channel-layer width than an upper transistor structure stacked thereabove, and
wherein the lower transistor structure of another at least one multi-stack transistor structure has a same channel-layer width as an upper transistor structure stacked thereabove.

4. The multi-stack semiconductor device of claim 3, wherein a difference between channel-layer widths of the lower transistor structures of two multi-stack transistor structures is an integer multiple of a difference between channel-layer widths of the lower transistor structures of another two multi-stack transistor structures.

5. The multi-stack semiconductor device of claim 4,
wherein each of the lower transistor structure and the upper transistor structure forms a nanosheet transistor structure.

6. The multi-stack semiconductor device of claim 4,
wherein the lower transistor structure and the upper transistor structure form a nanosheet transistor structure and a fin-field effect transistor (finFET) structure, respectively.

7. The multi-stack semiconductor device of claim 1,
wherein all of the upper transistor structures in the plurality of multi-stack transistor.

8. The multi-stack semiconductor device of claim 1,
wherein a difference between channel-layer widths of the lower transistor structures of the two multi-stack nanosheet structures is an integer multiple of a difference between channel-layer widths of the lower transistor structures of another two multi-stack transistor structures.

9. The multi-stack semiconductor device of claim 1,
wherein the lower transistor structure and the upper transistor structure form a nanosheet transistor structure and a fin-field effect transistor (finFET) structure, respectively.

10. A multi-stack semiconductor device comprising:
a substrate; and
a plurality of multi-stack nanosheet structures arranged on the substrate in a channel width direction,
wherein the multi-stack nanosheet structures comprise at least one lower nanosheet stack and at least one upper nanosheet stack formed above the lower nanosheet stack, wherein the lower and upper nanosheet stacks comprise a plurality of nanosheet layers as current channels for a transistor structure, and wherein the lower nanosheet stacks of a $1^{st}$ multi-stack nanosheet structure and a $2^{nd}$ multi-stack nanosheet structure among the multi-stack nanosheet structures have different channel widths, corresponding to widths of the nanosheet layers, in a channel width direction.

11. The multi-stack semiconductor device of claim 10, wherein the upper nanosheet stacks of the multi-stack nanosheet structures have a same channel width or different channel widths.

12. The multi-stack semiconductor device of claim 10, wherein the lower nanosheet stacks of a $3^{rd}$ multi-stack nanosheet structure and the $2^{nd}$ multi-stack nanosheet structure among the multi-stack nanosheet structures have a same channel width.

13. The multi-stack semiconductor device of claim 12, wherein the lower nanosheet stacks of the $2^{nd}$ and $3^{rd}$ multi-stack nanosheet structures have a greater channel width than the upper nanosheet stacks of the $2^{nd}$ and $3^{rd}$ multi-stack nanosheet structures, respectively, wherein, in the $2^{nd}$ multi-stack nanosheet structure, left side surfaces of the nanosheet layers of the lower nanosheet stack are vertically coplanar with left side surfaces of the nanosheet layers of the upper nanosheet stack, and right side surfaces of the nanosheet layers of the lower nanosheet stack are protruded from a vertical plane of right side surfaces of the nanosheet layers of the upper nanosheet stack, and wherein the $2^{nd}$ and $3^{rd}$ multi-stack nanosheet structures mirror-symmetric to each other in the channel width direction.

14. The multi-stack semiconductor device of claim 12, wherein the lower nanosheet stack of a $4^{th}$ multi-stack nanosheet structure among the multi-stack nanosheet structures has a channel width greater than the channel widths of the lower nanosheet stacks the $1^{st}$ to $3^{rd}$ multi-stack nanosheet structures.

15. The multi-stack semiconductor device of claim 14, wherein in the $4^{th}$ multi-stack nanosheet structure, left and right side surfaces of the nanosheet layers of the lower nanosheet stack are protruded from vertical planes of left and right side surfaces of the nanosheet layers of the upper nanosheet stack.

16. The multi-stack semiconductor device of claim 10, wherein the multi-stack nanosheet structures are connected to one another through the substrate which is a continuous structure without a connection mark.

17. A method of manufacturing a multi-stack semiconductor device, the method comprising operations of:

(a) stacking at least one set of lower nanosheet layers and sacrificial layers, and at least one set of upper nanosheet layers and sacrificial layers in this order on a substrate;

(b) patterning the set of upper nanosheet layers and sacrificial layers to obtain a plurality of upper nanosheet stacks;

(c) conformally forming a $1^{st}$ spacer layer on the upper nanosheet stacks;

(d) selectively removing the $1^{st}$ spacer layer formed on sidewalls of the upper nanosheet stacks such that the $1^{st}$ spacer layer on both sidewalls of a $1^{st}$ upper nanosheet stack and only one of two sidewalls of a $2^{nd}$ upper nanosheet stack are removed; and (e) patterning the set of lower nanosheet layers and sacrificial layers using the remaining $1^{st}$ spacer layer as mask to obtain a plurality of lower nanosheet stacks corresponding to the upper nanosheet stacks such that a width of a $2^{nd}$ lower nanosheet stack patterned below the $2^{nd}$ upper nanosheet stack is greater than a width of a $1^{st}$ lower nanosheet stack patterned below the $1^{st}$ upper nanosheet stack by a thickness of the $1^{st}$ spacer layer.

18. The method of claim 17, wherein, in operation (d), the $1^{st}$ spacer layer on only one of two sidewalls of a $3^{rd}$ upper nanosheet stack is further removed, and wherein, in operation (e), a $3^{rd}$ lower nanosheet stack corresponding to the $3^{rd}$ upper nanosheet stack is obtained such that a width of the $3^{rd}$ lower nanosheet stack is the same as the width of the $2^{nd}$ lower nanosheet stack.

19. The method of claim 18, wherein, in operation (d), the $1^{st}$ spacer layer on both sidewalls of a $4^{th}$ upper nanosheet stack is not removed, and wherein, in operation (e), a $4^{th}$ lower nanosheet stack corresponding to the $4^{th}$ upper nanosheet stack is obtained such that a width of the $4^{th}$ lower nanosheet stack is greater than the width of the $3^{rd}$ lower nanosheet stack by the thickness of the $1^{st}$ spacer layer.

20. The method of claim 19, further comprising:

(c-1) conformally forming a $2^{nd}$ spacer layer on a $5^{th}$ upper nanosheet stack, wherein, in operation (d), the $1^{st}$ spacer layer and the $2^{nd}$ spacer layer on both sidewalls of the $5^{th}$ upper nanosheet stack are not removed, and wherein, in operation (e), a $5^{th}$ lower nanosheet stack corresponding to the $5^{th}$ upper nanosheet stack is patterned using the remaining $1^{st}$ spacer layer and $2^{nd}$ spacer layer such that a width of the $5^{th}$ lower nanosheet stack is greater than the $4^{th}$ lower nanosheet stack by twice the thickness of the $2^{nd}$ spacer layer.

* * * * *